United States Patent
Kim et al.

(10) Patent No.: US 6,452,273 B1
(45) Date of Patent: Sep. 17, 2002

(54) SEMICONDUCTOR INTEGRATED CIRCUIT DEVICE AND METHOD OF MANUFACTURING THE SAME

(75) Inventors: Tae-Hun Kim, Suwon-shi (KR); Myoung-Seob Shim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/474,710

(22) Filed: Dec. 29, 1999

(30) Foreign Application Priority Data

Jan. 2, 1999 (KR) .................................. 1/1999

(51) Int. Cl.⁷ .............................................. H01L 23/48
(52) U.S. Cl. .................... 257/754; 257/754; 257/755; 257/756; 257/757; 257/758
(58) Field of Search ................. 257/755, 756, 257/757, 758, 754; 438/655, 630

(56) References Cited

U.S. PATENT DOCUMENTS

| | | | |
|---|---|---|---|
| 5,475,266 A | * 12/1995 | Rodder | 257/750 |
| 6,020,641 A | * 2/2000 | Lee et al | 257/755 |
| 6,147,405 A | * 11/2000 | Hu | 257/755 |
| 6,156,644 A | * 12/2000 | Ko et al | 438/639 |
| 6,175,146 B1 | * 1/2001 | Lane et al | 257/635 |
| 6,188,119 B1 | * 2/2001 | Ogawa et al | 257/435 |

OTHER PUBLICATIONS

US 6,239,493, 05/2001, Yoo et al. (withdrawn)*

* cited by examiner

*Primary Examiner*—Eddie Lee
*Assistant Examiner*—Joseph Nguyen
(74) *Attorney, Agent, or Firm*—Cantor Colburn LLP (57) ABSTRACT

A semiconductor integrated circuit device and method of manufacturing the same is presented. The device comprises a first conductive line formed on a semiconductor substrate. An insulating layer formed on the first conductive line and the semiconductor substrate has a first contact hole exposing the first conductive line. A second conductive line consisting of a polysilicon layer and a silicide layer thereon is formed on the insulating layer including the first contact hole. The polysilicon layer of the second conductive line extends from the sidewall of the first contact hole to the top of the insulating layer so as to expose the first conductive line. The silicide layer of the second conductive line is directly connected to the exposed first conductive line in the first contact hole. Contact resistance between a bit line and a word line on the device can be reduced by directly contacting a silicide layer of the word line and a silicide layer of the bit line.

7 Claims, 6 Drawing Sheets

SEMICONDUCTOR INTEGRATED CIRCUIT DEVICE AND METHOD OF MANUFACTURING THE SAME

BACKGROUND OF THE INVENTION

1. Field of the Invention

The present invention relates to a semiconductor integrated circuit device and method of manufacturing the same, and more particularly to a semiconductor integrated circuit device in which contact resistance between a bit line and a word line can be reduced and method of manufacturing the same.

2. Description of the Related Art

As semiconductor integrated circuit devices have progressed into high density integration and high speed performance, required design sizes of patterns formed in a chip have become smaller and spaces between interconnection lines have drastically decreased. Particularly, in a device such as a DRAM(dynamic random access memory) device, as the width of bit lines and word lines becomes narrower and the size of contacts becomes smaller, resistance in bit lines and word lines increases. Accordingly signal transfer delay(RC delay), cross talk (noise generating) and power consumption have become problems.

Therefore, research on architectural improvement and new material development to reduce interconnection resistance and manufacturing methods thereof have been performed. At present a polycide structure consisting of a polysilicon layer and a metal silicide layer thereon is widely applied to a bit line and a word line. The silicide has characteristics of ① low resistance like metal ② stability in high temperature ③ easiness of pattern formation in a silicon layer or a polysilcon layer ④ good mechanical stability such as good adherence and low stress ⑤ no reaction with upper metal layer ⑥ low contact resistance and low resistance susceptibility, and ⑦ no contamination with wafer apparatus. Accordingly silicide is widely accepted as a new metalization material.

In a DRAM device, the polycide structure is first applied to bit lines. For word lines in a device using above half-submicron technology, strapping lines making a corresponding contact between a word line and a metal line are formed for reducing resistance in word lines. However, in a DRAM device using below half-submicron technology, a sub word-line drive structure is used to inhibit resistance increase in word lines instead because metal interconnection lines can not be formed narrow enough to form strapping lines. At present, a polycide structure is also applied to a word line to reduce resistance of the word line itself. However, a polycide word line structure applied in a highly integrated DRAM device reduces sheet resistance, but contact resistance between a word line and a bit line formed in peripheral circuit regions increases.

Figure 1:
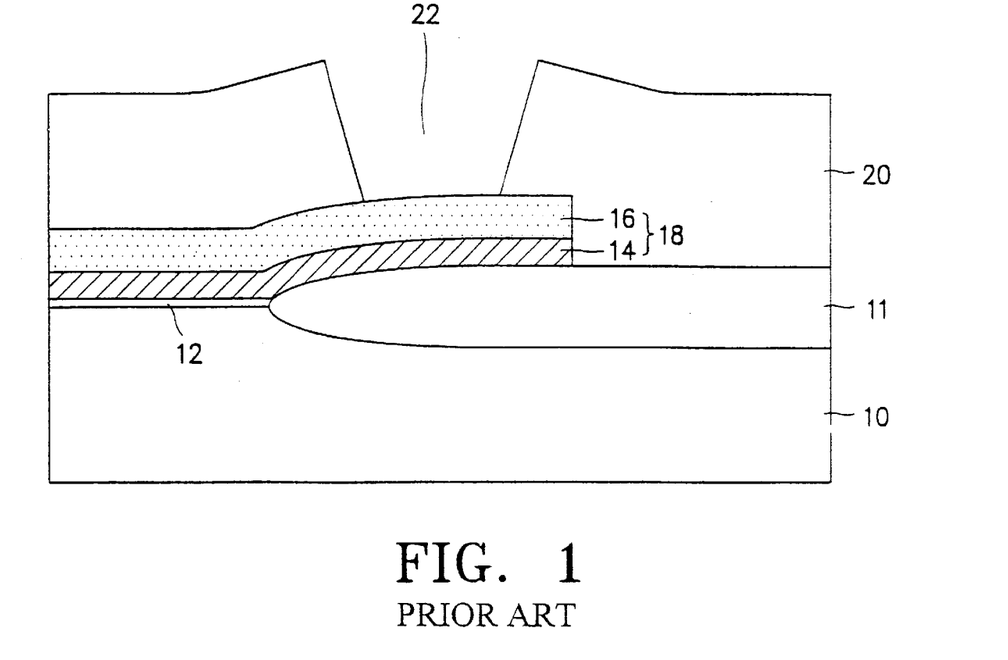
FIG. 1 and FIG. 2 are cross-sectional views for illustrating a conventional method of manufacturing a semiconductor integrated circuit device having a polycide word line and a polycide bit line.
Figure 2:
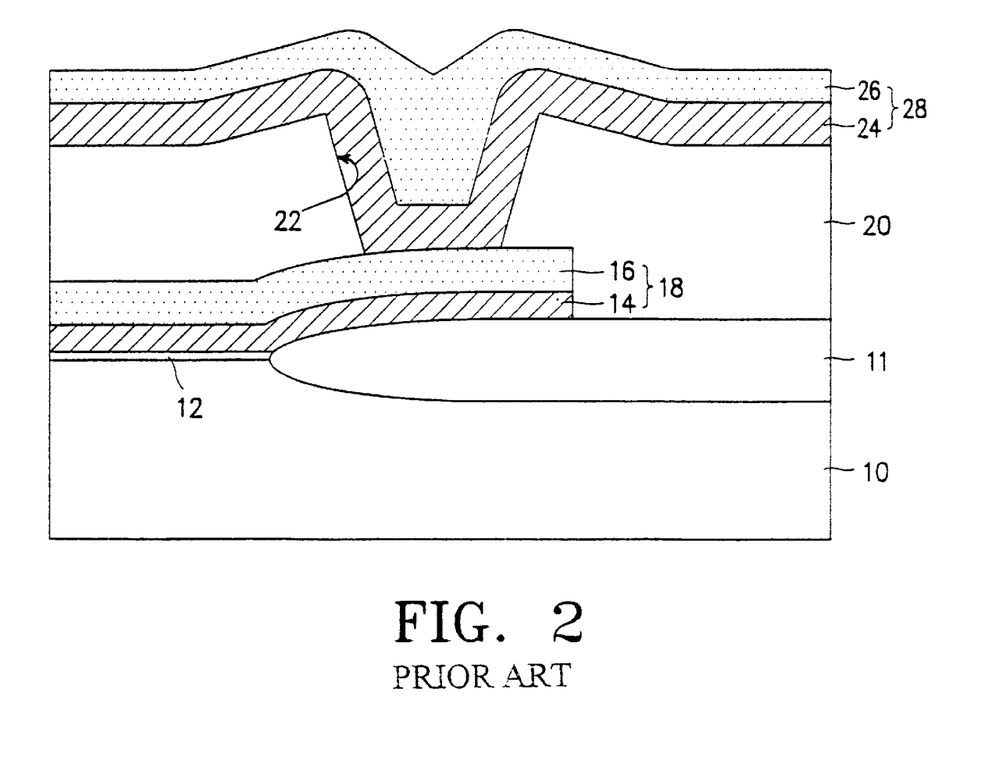

FIG. 1 and FIG. 2 are cross-sectional views for illustrating a conventional method for manufacturing a semiconductor integrated circuit device having a polycide word line and a polycide bit line.

Referring to FIG. 1, after forming a gate oxide(12) by thermal oxidation on a semiconductor substrate(10), in which an active region and a device isolation region are divided by a field oxide(11), an impurity (for example phosphorus) doped first polysilicon layer(14) and a first silicide layer(16) are formed consecutively thereon. Subsequently, patterning of the first silicide layer(16) and the first polysilicon layer(14) by a photo-etching method forms a polycide word line(18). Thereafter an insulating layer(20) on the entire surface including the polycide word line(18) and the field oxide(11) is formed. Subsequently, a contact hole(22) exposing the first silicide layer(16) of the word line(18) is formed by a photo-etching method.

Referring to FIG. 2, an impurity(for example phosphorus) doped second polysilicon layer(24) and a second silicide layer(26) are formed consecutively on the insulating layer (20) and the contact hole(22). Subsequently, a polycide bit line(28) connected electrically to the word line(18) is formed by patterning the second silicide layer(26) and the second polysilicon layer(24) by a photo-etching method.

In the conventional method as described above, impurity (for example phosphorus) doped in the second polysilicon layer (24)of the bit line positioned between the second silicide layer(26) of the bit line and the first silicide layer(16) of the word line, diffuse out to the adjacent silicide layer(the first silicide layer (16) of the word line) in a subsequent heat treatment (for example 800–1000° C., $N_2$ ambient, 30 minutes). In worse case conditions, the impurity diffuses out also to the first polysilicon layer (14) of the word line. Accordingly, impurity concentration in the second polysilicon layer (24) of the bit line is drastically reduced due to impurity redistribution as described above. As a result contact resistance between the bit line(28) and the word line(18) is increased.

To take care of this situation, an additional ion implantation after forming the contact between the bit line (28) and the word line(18) is performed. However this additional ion implantation makes cell isolation characteristics weak, because ions are injected also into cell array regions.

SUMMARY OF THE INVENTION

Accordingly, an object of the present invention is to provide a semiconductor integrated circuit device in which contact resistance between a first polycide layer and a second polycide layer can be reduced.

Another object of the present invention is to provide a semiconductor integrated circuit device in which contact resistance between a word line and a bit line can be reduced.

Still, another object of the present invention is to provide a method of manufacturing a semiconductor integrated circuit device so as to reduce contact resistance between a word line and a bit line.

In an exemplary embodiment of the present invention, there is provided a semiconductor integrated circuit device comprising a first conductive line formed on a semiconductor substrate. An insulating layer formed on the first conductive line and the semiconductor substrate has a first contact hole exposing the first conductive line. A second conductive line consisting of a polysilicon layer and a silicide layer thereon is formed on the insulating layer including the first contact hole. The polysilicon layer of the second conductive line is formed extended from the sidewall of the first contact hole to the top of the insulating layer so as to expose the first conductive line. The silicide layer of the second conductive line is formed so that it is directly connected to the exposed first conductive line in the first contact hole.

In a preferred exemplary embodiment, the first conductive line preferably consists of a polysilicon layer and a silicide layer thereon. The polysilicon layer of the second conductive line is formed extended from the sidewall of the first contact hole to the top of the insulating layer so as to expose the silicide layer of the first conductive line. The silicide layer of the second conductive line is formed so that it is directly connected to the exposed silicide layer of the first conductive line.

In an alternate embodiment of the present invention, there is provided a method of manufacturing a semiconductor integrated circuit device. The method comprises forming a first conductive line on a semiconductor substrate; forming an insulation layer on the semiconductor substrate in which the first conductive line is formed; forming a first contact hole exposing the first conductive line by etching the insulating layer; forming a polysilicon layer of a second conductive line on the insulating layer including the first contact hole; exposing the first conductive line by removing the polysilicon layer of the second conductive line formed on the bottom area of the first contact hole by etching the polysilicon layer of the second conductive line; and connecting directly the exposed first conductive line to a silicide layer of the second conductive line by forming the silicide layer on the exposed first conductive line and the polysilicon layer of the second conductive line.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Reference will now be made in detail to the preferred embodiments of the present invention.

FIG. 3 through FIG. 7 are cross-sectional views for illustrating a method of manufacturing a semiconductor integrated circuit device having a polycide word line and a polycide bit line in accordance with a first embodiment of the present invention.

Figure 3:
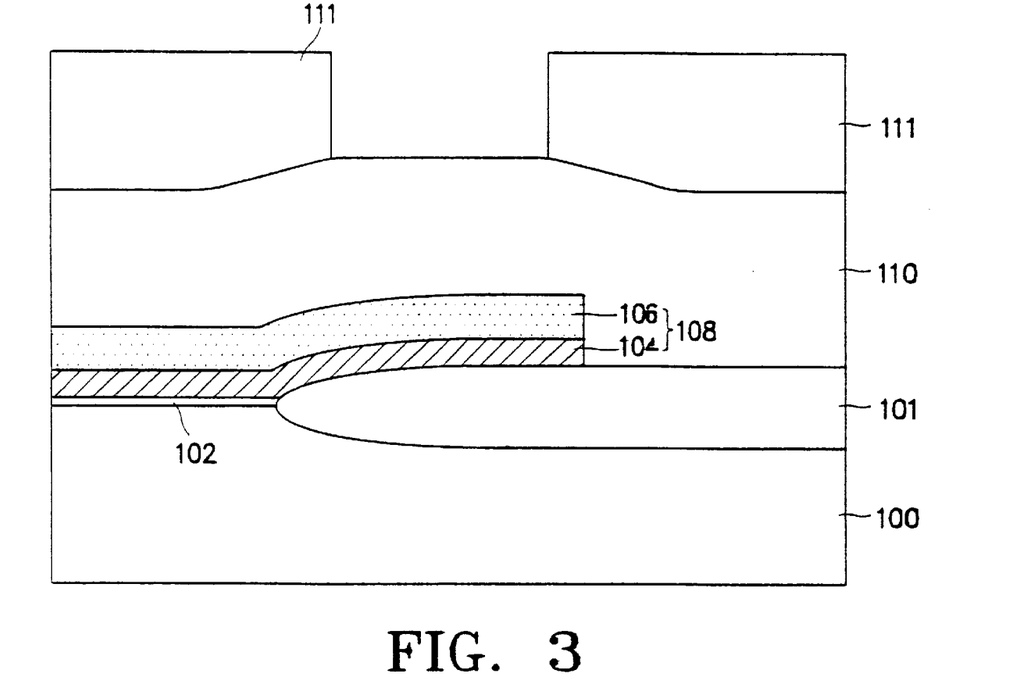
FIG. 3 through FIG. 7 are cross-sectional views for illustrating a method of manufacturing a semiconductor integrated circuit device according to a first embodiment of the present invention.

FIG. 3 illustrates forming a word line(108) and an insulating layer(110). First, an active region and a device isolation region are divided by field oxide(101) formed by a normal device isolation process in a semiconductor substrate (100). After forming a gate oxide(102) on the semiconductor substrate(100) by thermal oxidation, an impurity(for example phosphorus) doped first polysilicon layer(104) of 1000–1500 Å is formed thereon by LPCVD(low pressure chemical vapor deposition) method. A first silicide layer (106), such as a tungsten silicide layer, is formed at thickness of about 1000 Å on the first polysilicon layer(104) by low pressure chemical vapor deposition method. Subsequently, after forming a word line(108) by patterning the first silicide layer(106) and the first polysilicon layer(104) by a photo-etching process, an insulting layer(110) on the word line (108) and the field oxide(101) is formed. Preferably, the insulating layer(110) comprises of a high temperature oxide layer of about 700 Å and BPSG (borophosphosilicate glass) layer of about 3000 Å thereon. Also, planarization of the insulating layer(110) is performed by reflow process for 30 minutes in $N_2$ ambient at about 850° C. Thereafter, a photoresist pattern (111) for forming a contact hole on the insulating layer(110) is formed by a photo process.

Figure 4:
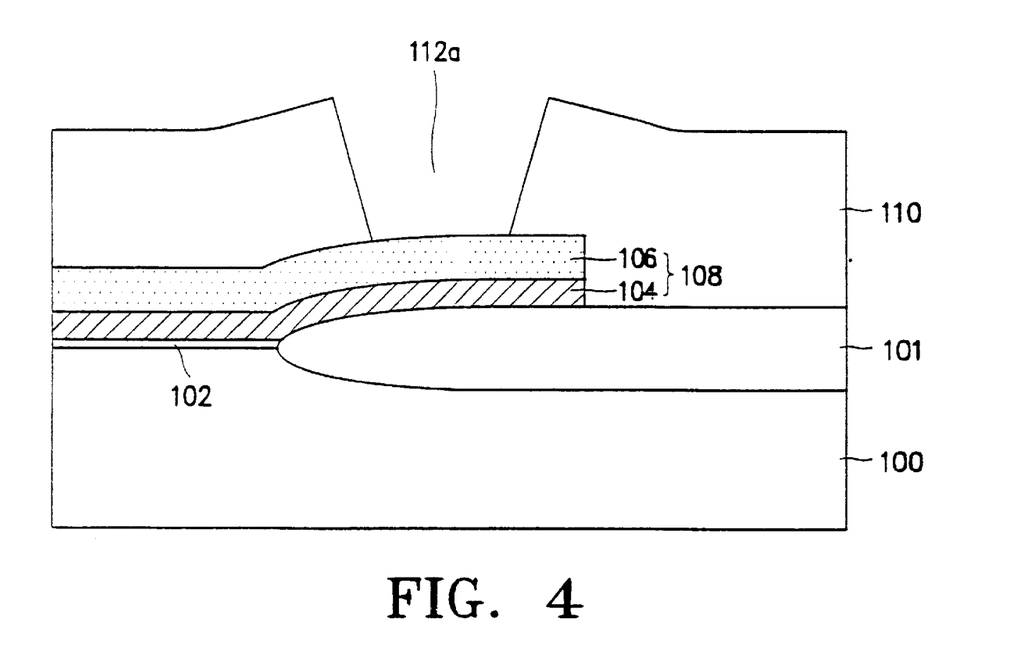

FIG. 4 illustrates forming a first contact hole(112a). A first contact hole(112a) exposing the first silicide layer(106) of the word line(108) in peripheral circuit regions and a second contact hole (reference number 112b in FIG. 7b) exposing a drain area of a transistor(not shown) in memory cell regions are formed by etching the insulating layer(110) using the photoresist pattern (111) as an etch mask. Then, the photoresist pattern(111) is removed.

Figure 5:
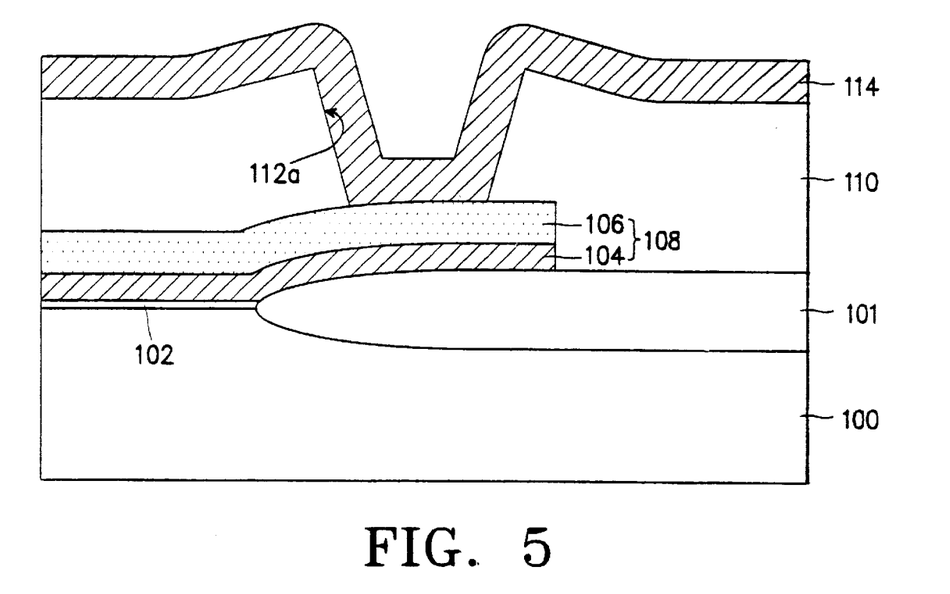

FIG. 5 illustrates forming an impurity(for example phosphorus) doped second polysilicon layer(114) on the insulating layer(110) including the first contact hole(112a) and the second contact hole. Preferably, the second polysilicon layer(114) having a thickness of about 2000 Å is formed by a low pressure chemical vapor deposition method.

Figure 6:
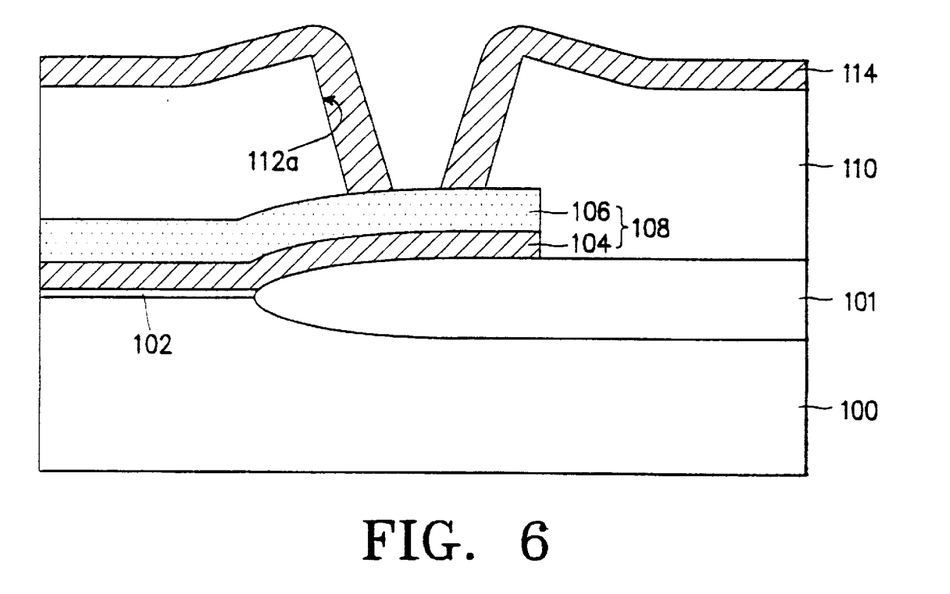

FIG. 6 illustrates planarization of the second polysilicon layer(114) by etching the entire second polysilicon layer. As a result, the second polysilicon layer(114) is removed to expose the first silicide layer(106) at the bottom area of the first contact hole(112a). In the other regions the second polysilicon layer is etched back to approximately a thickness of 700 Å.

Preferably, etching the second polysilicon layer is performed by using plasma. The chuck holding the substrate in which material to be etched is formed is a cathode and the opposite chuck is an anode. The etching is performed by adding alternating current to the cathode chuck and grounding the anode chuck, or by applying a magnetic field to plasma using alternating current and magnetic coil. Stepped areas are etched more than plane areas when this etching method is performed. Resultantly, while the second polysilicon layer of the bit line at the bottom area of the first contact hole(112a) in which the first silicide layer(106) of the word line and the second polysilicon layer (114)of the bit line are in contact is entirely removed. The second polysilicon layer (114) in the other area is etched back to a certain thickness. At this stage, the second polysilicon layer (114) in the second contact hole (112b) remains as shown in FIG. 7b. This is because the depth of the second contact hole (reference number 112b in FIG. 7b) in which an active region of the substrate (100) and the second polysilicon layer (114) of the bit line are in contact is deeper than that of the first contact hole. However, the second polysilicon layer on the insulating layer(110), besides on the sidewalls of the first contact hole(112a) and in the second contact hole, can be entirely removed.

Figure 7A:
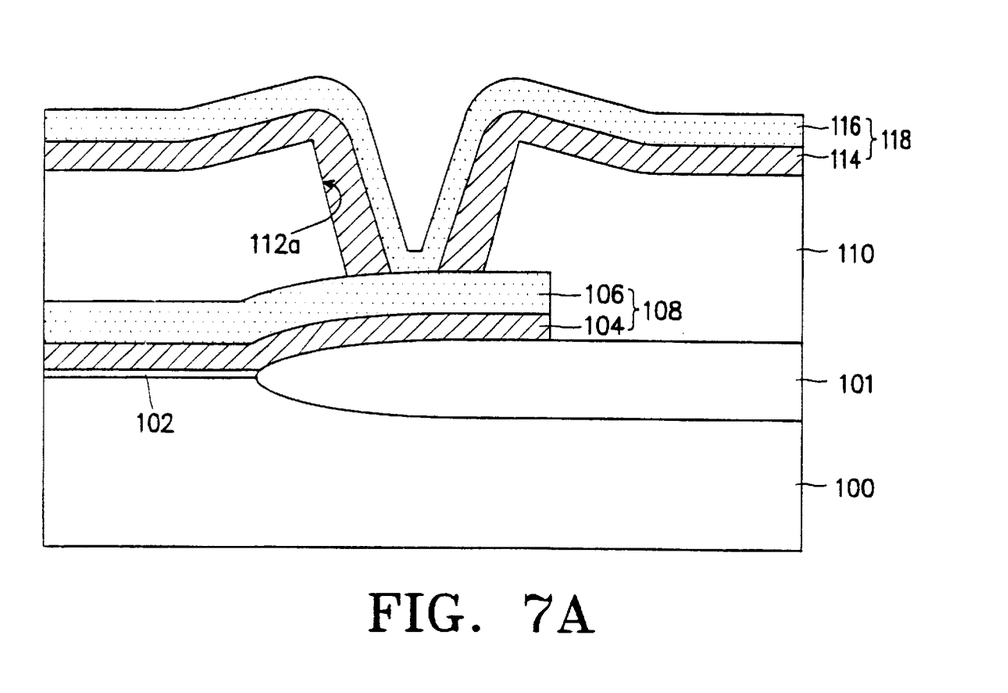
Figure 7B:
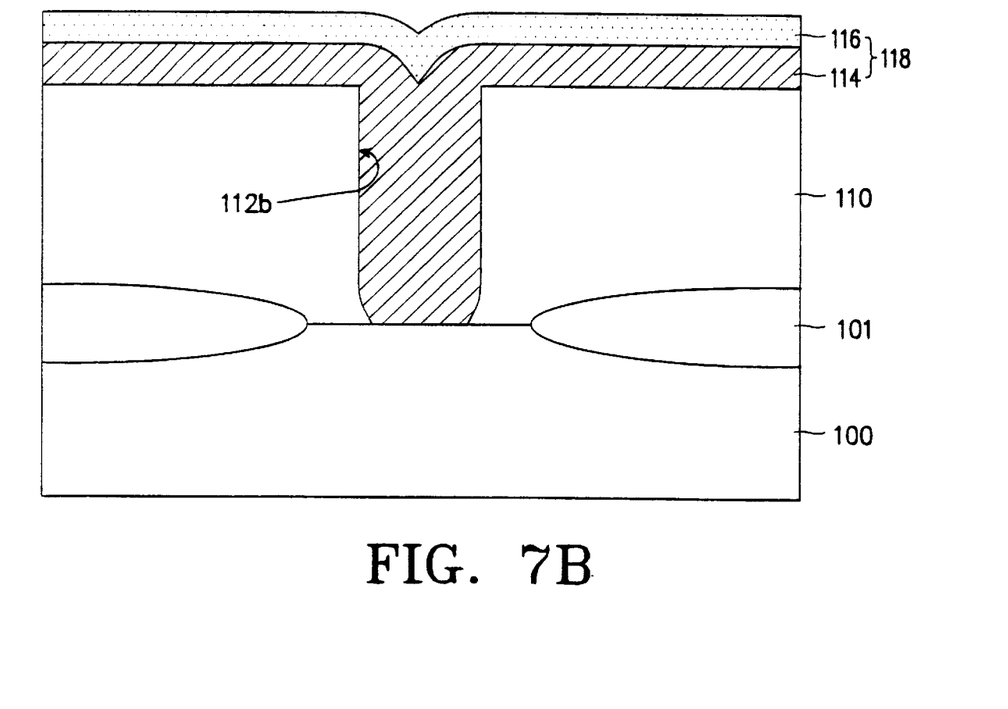

FIG. 7a and FIG. 7b illustrate forming a bit line(118). FIG. 7a illustrates a peripheral circuit region and FIG. 7b illustrates a memory cell region. After etching back the second polysilicon layer(114) as above, removing residue of the second polysilicon layer(114) on the exposed first silicide layer(106) is performed. Preferably, the removing of the residue is performed using dry etching. Thereafter, a washing of removing metal impurities and organic contaminants on the wafer is performed using SC-1(standard cleaning; organic material with mixed ratio of $NH_4OH: H_2O_2: H_2O=$ 1:4:20). Then a washing of removing native oxide formed on the second polysilicon layer(114) is performed using a mixed solution of HF and ultra pure water with ratio of 1:200.

Subsequently, a second silicide layer(116) of about 1500 Å on the second polysilicon layer and the exposed first silicide layer is formed by low pressure chemical vapor deposition A bit line(118) is then formed by patterning the second silicide layer(116) and the second polysilicon layer (114) by a photo-etching method. At this stage, the second silicide layer(116) is directly connected to the exposed first silicide layer (106) of the word line in the first contact hole(112a) in peripheral circuit regions. On the other hand, in memory cell regions the second silicide layer(116) of the bit line is not directly connected to an active area in the substrate(100) because the second contact hole (112b) exposing the active area in the substrate(100) is covered by the second polysilicon layer(114) of the bit line.

Figure 8:
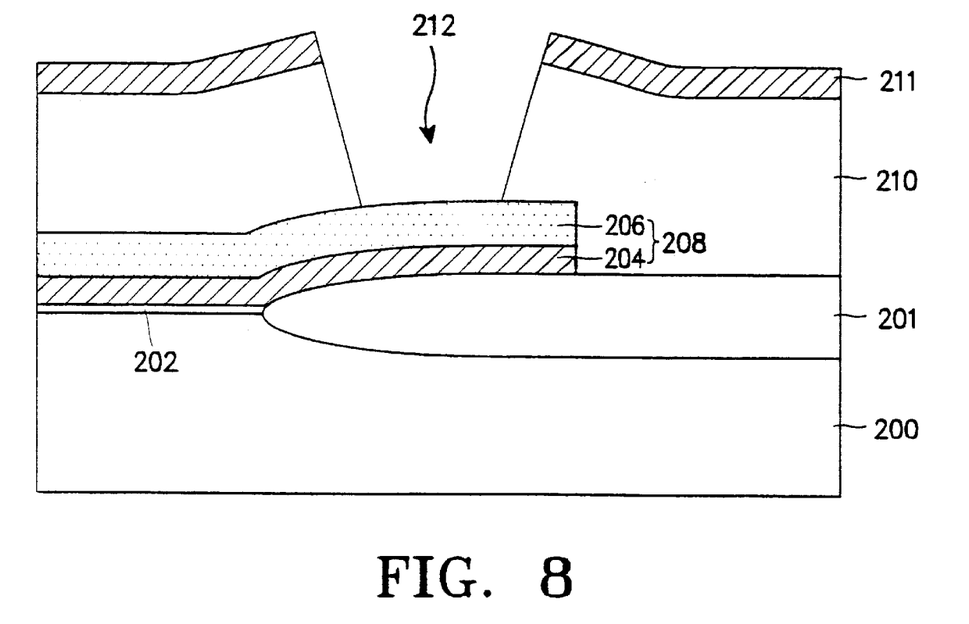
FIG. 8 through FIG. 10 are cross-sectional views for illustrating a method of manufacturing a semiconductor integrated circuit device according to a second embodiment of the present invention.
Figure 9:
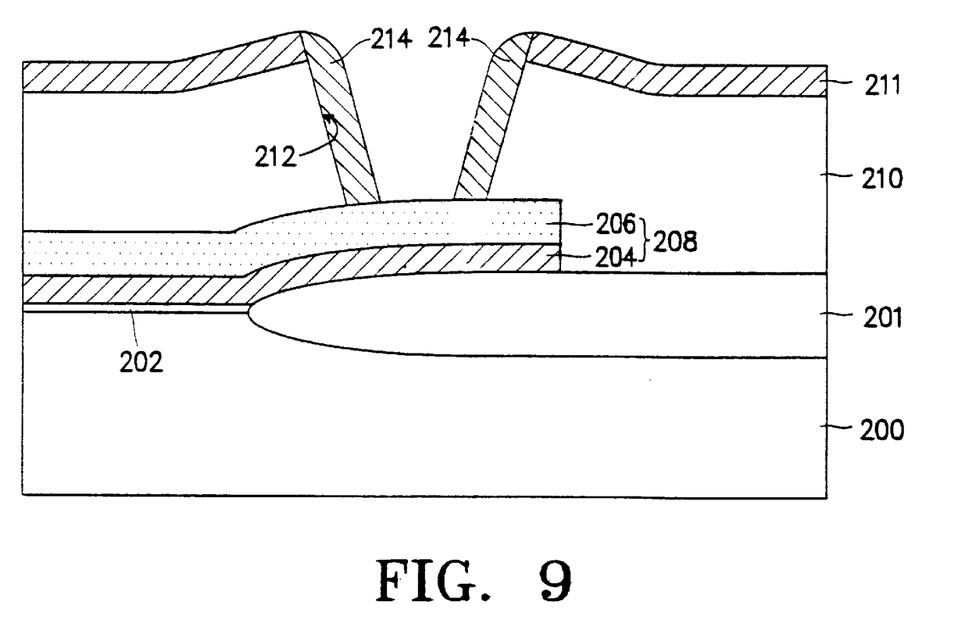
Figure 10:
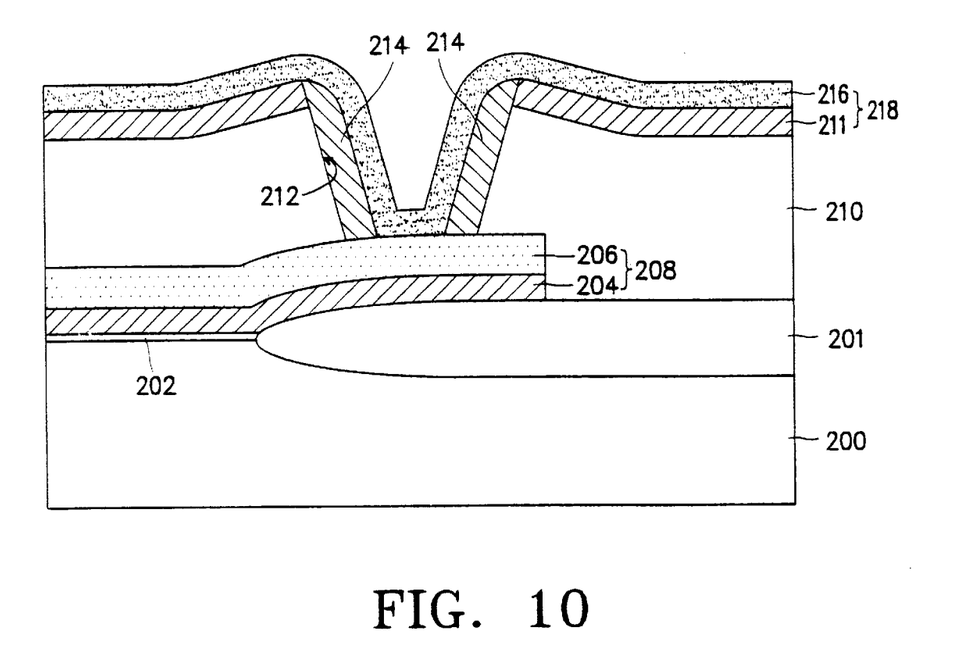

FIG. 8 through FIG. 10 are cross-sectional views for illustrating a method of manufacturing a semiconductor integrated circuit device having a polycide word line and a polycide bit line in accordance with a second embodiment of the present invention.

Referring to FIG. 8, according to the same method as the method in the first embodiment of the present invention, a gate insulating layer(202), a word line consisting of a first polysilicon layer(204) and a first silicide layer(206), and an insulating layer(210) are formed on a semiconductor substrate(200). The substrate (200) has an active region and a device isolation region divided by a field oxide(201).

Subsequently, an impurity(for example phosphorus) doped second polysilicon layer(211) of about 100Å–2000 Å is formed by low pressure chemical vapor deposition. Preferable thickness is about 1000 Å. Thereafter, a first contact hole(212) exposing the first silicide layer(206) of the word line(208) in a peripheral circuit region, and a second contact hole(not shown) exposing a drain area(not shown) of a transistor in the substrate(200) in a memory cell region are formed by photo-etching the second polysilicon layer(211) and the insulating layer(210)

Referring to FIG. 9, forming an impurity(for example phosphorus) doped third polysilicon layer(214) on the second polysilicon layer(211), the first contact hole(212) and the second contact hole is illustrated. Preferably, the third polysilicon layer(214) of about 2000 Å is formed by low pressure chemical vapor deposition. Preferably the impurity concentration of the second polysilicon layer(211) is substantially the same as that of the third polyslicon layer(214).

Referring to FIG. 10, illustrated is planarization of the third polysilicon layer(214) by etching the entire third polysilicon layer. As a result, the third polysilicon layer(214) is removed to expose the first silicide layer(206) at the bottom area of the first contact hole region(212), and the other region of the third polysilicon layer(214) is entirely etched back. However, the third polysilicon layer(214) may remain at a predetermined thickness on the second polysilicon layer(211) according to etching conditions. Also, the third polysilicon(214) layer remains in the second contact hole. This is because the second contact hole, in which an active region in the substrate(200) and the third polysilicon layer(214) of the word line are in contact, is deeper than the first contact hole.

Here, even though the third polysilicon layer(214) is over etched in the other region beside the first contact hole(212), the second polysilicon layer(211) makes it possible to obtain a required thickness in connection with a predetermined resistance.

Then, removing residue of the third polysilicon layer(214) on the exposed first silicide layer(206) in the first contact hole(212) is performed. Preferably, the removing is performed using dry etching. Thereafter, a washing to remove metal impurities and organic contaminants on the wafer is performed using SC-1(standard cleaning; organic material with mixed ratio of $NH_4OH$: $H_2O_2$: $H_2O$=1:4:20). Then a washing to remove native oxide formed on the third polysilicon layer(214) is performed using a mixed solution of HF and ultra pure water with ratio of 1:200.

Subsequently, a second silicide layer(216), such as a tungsten silicide layer at about 1500 Å thickness, is formed on the second polysilicon layer and the exposed first silicide layer by low pressure chemical vapor deposition. A bit line(218) is then formed by patterning the second silicide layer(216), the third polysilicon layer(214) and the second polysilicon layer(211) by a photo-etching method. At this stage, the second silicide layer(216) is directly connected to the exposed first silicide layer(206) of the word line in the first contact hole(212) in peripheral circuit regions. On the other hand, in memory cell regions the second silicide layer(216) of the bit line is not directly connected to an active area in the substrate(200) because the second contact hole exposing the active area in the substrate(200) is filled up by the third polysilicon layer(214) of the bit line.

In accordance with the present invention as described above, contact resistance increase incurred by diffusion of impurity doped in the polysilicon layer of the bit line in subsequent heat treatment can be prevented by directly connecting the silicide layer of the word line to the silicide layer of the bit line.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A semiconductor integrated circuit device, comprising:
   a first conductive line formed on a semiconductor substrate;
   an insulating layer formed on said first conductive line and said semiconductor substrate, said insulating layer having a first contact hole exposing said first conductive line; and
   a second conductive line including a polysilicon layer and a silicide layer, said second conductive line disposed on said insulating layer having said first contact hole,
   wherein said polysilicon layer of said second conductive line extends from a sidewall of said first contact hole to a top of said insulating layer so as to expose said first conductive line, and said silicide layer of said second conductive line is directly connected to said exposed first conductive line in said first contact hole.

2. The semiconductor integrated circuit device according to claim 1, wherein said first conductive line includes a polysilicon layer and a silicide layer.

3. The semiconductor integrated circuit device according to claim 2, wherein said polysilicon layer of said second conductive line extends from said sidewall of said first contact hole to said top of said insulating layer so as to expose said silicide layer of said first conductive line, and said silicide layer of said second conductive line is directly connected to said exposed silicide layer of said first conductive line.

4. The semiconductor integrated circuit device according to claim 2, wherein said polysilicon of said second conductive line is formed at substantially uniform thickness on said insulating layer.

5. The semiconductor integrated circuit device according to claim 1, wherein said device includes a second contact hole for connecting said second conductive line to an active region of said semiconductor substrate, said second contact hole being substantially filled up by said polysilicon layer of said second conductive line.

6. The semiconductor integrated circuit device according to claim 1, wherein said first conductive line comprises a word line.

7. The semiconductor integrated circuit device according to claim 1, wherein said second conductive line comprises a bit line.

* * * * *